(12) United States Patent
Weng et al.

(10) Patent No.: US 11,189,574 B2
(45) Date of Patent: Nov. 30, 2021

(54) MICROELECTRONIC PACKAGE HAVING ELECTROMAGNETIC INTERFERENCE SHIELDING

(71) Applicant: Intel Corporation, Santa Clara, CA (US)

(72) Inventors: Li-Sheng Weng, San Diego, CA (US); Chung-Hao Chen, Portland, OR (US); James C. Matayabas, Jr., Gilbert, AZ (US); Min Keen Tang, Taman Sri Nibong (MY)

(73) Assignee: Intel Corporation, Santa Clara, CA (US)

( * ) Notice: Subject to any disclaimer, the term of this patent is extended or adjusted under 35 U.S.C. 154(b) by 44 days.

(21) Appl. No.: 16/606,628

(22) PCT Filed: May 31, 2017

(86) PCT No.: PCT/US2017/035273
§ 371 (c)(1),
(2) Date: Oct. 18, 2019

(87) PCT Pub. No.: WO2018/222187
PCT Pub. Date: Dec. 6, 2018

(65) Prior Publication Data
US 2021/0118809 A1    Apr. 22, 2021

(51) Int. Cl.
*H01L 23/552* (2006.01)
*H01L 23/31* (2006.01)
(Continued)

(52) U.S. Cl.
CPC ........ *H01L 23/552* (2013.01); *H01L 23/3128* (2013.01); *H01L 24/18* (2013.01);
(Continued)

(58) Field of Classification Search
CPC . H01L 23/552; H01L 24/18; H01L 2924/181; H01L 23/3128;
(Continued)

(56) References Cited

U.S. PATENT DOCUMENTS 9,935,075 B2 *   4/2018  Huang ................. H01L 23/552
2005/0274932 A1* 12/2005  Knight ................. H01L 23/552
                                            252/500

(Continued)

OTHER PUBLICATIONS

International Preliminary Report on Patentability for PCT Application No. PCT/US17/35273, dated Dec. 12, 2019.
(Continued)

*Primary Examiner* — Jasmine J Clark
(74) *Attorney, Agent, or Firm* — Essential Patents Group, LLP.

(57) ABSTRACT

A microelectronic package may be fabricated with a microelectronic substrate, a microelectronic die electrically attached to the microelectronic substrate, and an electromagnetic interference shield layer contacting one or both of the microelectronic substrate and the microelectronic die, wherein the electromagnetic interference shield layer has an electrical conductivity between about 10,000 siemens per meter and 100,000 siemens per meter. The specific range of electrical conductivity results in electromagnetic fields either generated by the microelectronic die or generated by components external to the microelectronic package scattering within the electromagnetic interference shield layer and attenuating. Thus, the electromagnetic interference shield layer can prevent electromagnetic field interference without the need to be grounded.

24 Claims, 8 Drawing Sheets

(51) Int. Cl.
  *H01L 23/00* (2006.01)
  *H05K 9/00* (2006.01)
(52) U.S. Cl.
  CPC .. *H05K 9/0073* (2013.01); *H01L 2223/54486* (2013.01); *H01L 2924/181* (2013.01)
(58) Field of Classification Search
  CPC ... H01L 2924/3025; H01L 2223/54486; H01L 2224/2929; B29C 70/882; H05K 9/0073
  See application file for complete search history.

(56) References Cited

U.S. PATENT DOCUMENTS

| | | |
|---|---|---|
| 2007/0056769 A1 | 3/2007 | Severance et al. |
| 2011/0115059 A1 | 5/2011 | Lee et al. |
| 2011/0298101 A1 | 12/2011 | Pagaila et al. |
| 2016/0365317 A1 | 12/2016 | Keigler et al. |
| 2017/0141046 A1 | 5/2017 | Jeong et al. |

OTHER PUBLICATIONS

International Search Report and Written Opinion for PCT Application No. PCT/US17/35273, dated Jan. 31, 2018, 9 pgs.

* cited by examiner

MICROELECTRONIC PACKAGE HAVING ELECTROMAGNETIC INTERFERENCE SHIELDING

CLAIM OF PRIORITY

This Application is a National Stage Entry of, and claims priority to, PCT Application No. PCT/US2017/035273, filed on May 31, 2017, and titled "MICROELECTRONIC PACKAGE HAVING ELECTROMAGNETIC INTERFERENCE SHIELDING", which is incorporated by reference in its entirety for all purposes.

TECHNICAL FIELD

Embodiments of the present description generally relate to the field of microelectronic package fabrication, and, more particularly, to microelectronic packages having electromagnetic interference shielding.

BACKGROUND

The microelectronic industry is continually striving to produce ever faster, smaller, and thinner microelectronic packages for use in various electronic products, including, but not limited to, computer server products and portable products, such as portable computers, electronic tablets, cellular phones, digital cameras, and the like.

As products and microelectronic packages get smaller, their components are positioned closer to one another, thus electromagnetic fields that may be generated by the components may interfere with operation of other components within the products. One approach to reduce such electromagnetic field interference is through the use of a Faraday cage, which is a highly electrically conductive structure that is grounded and encloses selected components within a product or package. Such Faraday cages not only contain electromagnetic fields generated by the component(s) that it encloses, but also prevent external or ambient electromagnetic fields, such as radio frequency energy, from effecting the functionality of the enclosed component(s), as will be understood to those skilled in the art. However, the use of Faraday cages can increase design challenges, manufacturing costs, and size of the products.

Another approach to reduce electromagnetic field interference is to apply a magnetic absorber material, such as a magnetic tape, to selected components within the products. However, such magnetic absorber materials need to be formulated with specific magnetic properties to absorb specific frequency bands of an electromagnetic field. Also, such magnetic absorber materials can only absorb electromagnetic field frequency bands up to a few gigahertzes, so they are not able to mitigate electromagnetic fields that are in the high frequency spectrum.

Thus, there is an ongoing drive to develop improved electromagnetic field shielding structures for electronic products.

BRIEF DESCRIPTION OF THE DRAWINGS

The subject matter of the present disclosure is particularly pointed out and distinctly claimed in the concluding portion of the specification. The foregoing and other features of the present disclosure will become more fully apparent from the following description and appended claims, taken in conjunction with the accompanying drawings. It is understood that the accompanying drawings depict only several embodiments in accordance with the present disclosure and are, therefore, not to be considered limiting of its scope. The disclosure will be described with additional specificity and detail through use of the accompanying drawings, such that the advantages of the present disclosure can be more readily ascertained, in which:

DESCRIPTION OF EMBODIMENTS

Figure 1:
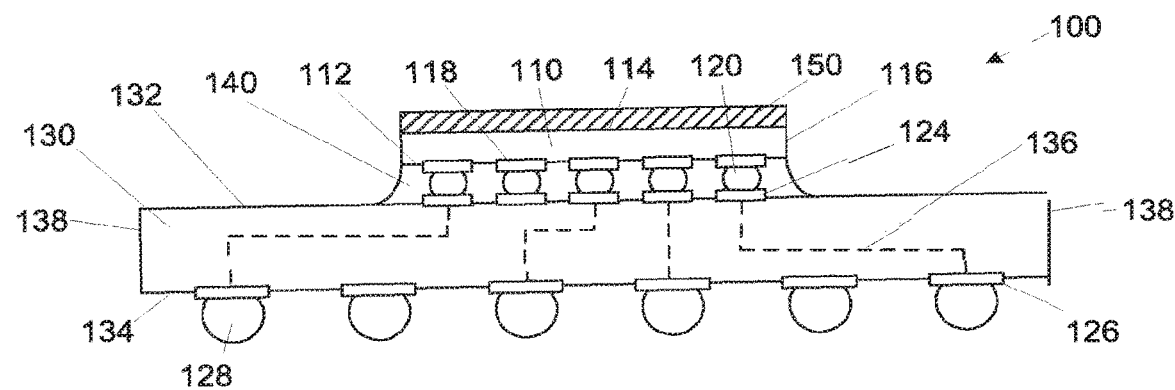
FIG. 1 is a side cross-sectional view of a microelectronic die attached to a microelectronic substrate with an electromagnetic interference shield layer disposed on a back surface of the microelectronic die to form a microelectronic package, according to an embodiment of the present description.

In the following detailed description, reference is made to the accompanying drawings that show, by way of illustration, specific embodiments in which the claimed subject matter may be practiced. These embodiments are described in sufficient detail to enable those skilled in the art to practice the subject matter. It is to be understood that the various embodiments, although different, are not necessarily mutually exclusive. For example, a particular feature, structure, or characteristic described herein, in connection with one embodiment, may be implemented within other embodiments without departing from the spirit and scope of the claimed subject matter. References within this specification to "one embodiment" or "an embodiment" mean that a particular feature, structure, or characteristic described in connection with the embodiment is included in at least one implementation encompassed within the present description. Therefore, the use of the phrase "one embodiment" or "in an embodiment" does not necessarily refer to the same embodiment. In addition, it is to be understood that the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled. In the drawings, like numerals refer to the same or similar elements or functionality throughout the several views, and that elements depicted therein are not necessarily to scale with one another, rather individual elements may be enlarged or reduced in order to more easily comprehend the elements in the context of the present description.

The terms "over", "to", "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

Embodiments of the present description include microelectronic packages having a microelectronic substrate, a microelectronic die electrically attached to the microelectronic substrate, and an electromagnetic interference shield layer contacting one or both of the microelectronic substrate and the microelectronic die, wherein the electromagnetic interference shield layer has an electrical conductivity between about 10,000 siemens per meter and 100,000 siemens per meter. The specific range of electrical conductivity results in electromagnetic fields either generated by the microelectronic die or generated by components external to the microelectronic package scattering within the electromagnetic interference shield layer and attenuating. Thus, the electromagnetic interference shield layer can prevent electromagnetic field interference without the need to be grounded.

As shown in FIG. 1, one embodiment of a microelectronic package 100 of the present description may include at least one microelectronic die 110, such as a microprocessor, a chipset, a graphics device, a wireless device, a memory device, an application specific integrated circuit, or the like, attached to a microelectronic substrate 130, such as an interposer, through a plurality of interconnects 120. The interconnects 120 may extend between bond pads 118 on an active surface 112 of the microelectronic die 110 and corresponding bond pads 124 on a first surface 132 of the microelectronic substrate 130, in a configuration generally known as a flip-chip or controlled collapse chip connection ("C4") configuration. The microelectronic die bond pads 118 may be in electrical communication with integrated circuitry (not shown) within the microelectronic die 110. The microelectronic substrate bond pads 124 may be in electrical communication with conductive routes 136 within the microelectronic substrate 130. The conductive routes 136 may provide electrical communication routes between the microelectronic die 110 on the microelectronic substrate 130 and/or to other components (not shown), and may provide electrical communication routes to attachment bond pads 126 on a second surface 134 of the microelectronic substrate 130 for attachment to a microelectronic board (not shown). External interconnects 128 may be attached to the attachment bond pads 126.

As also shown in FIG. 1, an electrically-insulating underfill material 140 may be disposed between the microelectronic die 110 and the microelectronic substrate 130, and around the interconnects 120. The underfill material 140 may be used to overcome the mechanical stress issues that can arise from thermal expansion mismatch between the microelectronic die 110 and the microelectronic substrate 130, thereby enhancing the reliability of the interconnects 120. The underfill material 140 may be an epoxy material that has sufficiently low viscosity to be wicked between the microelectronic die 110 and the microelectronic substrate 130 by capillary action when introduced by an underfill material dispenser (not shown) along at least one side 116 of the microelectronic die 110, which will be understood to those skilled in the art.

The microelectronic substrate 130 may comprise any appropriate dielectric material, including, by not limited to, liquid crystal polymer, epoxy resin, bismaleimide triazine resin, FR4, polyimide materials, and the like. The conductive routes 136 may be formed of any appropriate conductive material, including, but not limited to, copper, silver, gold, nickel, and alloys thereof. It is understood that the microelectronic substrate 130 may be formed from any number of dielectric layers and may contain active and/or passive microelectronic devices (not shown) formed therein. It is further understood that the conductive routes 136 could form any desired electrical route within the microelectronic substrate 130 and/or with additional external components (not shown). It is also understood that solder resist layers (not shown) could be utilized on the microelectronic substrate first surface 132 and/or the microelectronic substrate second surface 134, as will be understood to those skilled in the art. The processes used for forming the microelectronic substrate 130 are well known to those skilled in the art, and for the sake of brevity and conciseness will not be described or illustrated herein.

The interconnects 120 and the external interconnects 140 can be made from any appropriate material, including, but not limited to, solder materials and conductive filled epoxies. Solder materials may include any appropriate material, including but not limited to, lead/tin alloys, such as 63% tin/37% lead solder, or lead-free solders, such a pure tin or high tin content alloys (e.g. 90% or more tin), such as tin/bismuth, eutectic tin/silver, ternary tin/silver/copper, eutectic tin/copper, and similar alloys.

As shown in FIG. 1, the microelectronic package 100 may further include an electromagnetic interference shield layer 150 disposed on a back surface 114 of the microelectronic die 110. In one embodiment of the present description, the electromagnetic interference shield layer 150 has an electrical conductivity between about 10,000 siemens per meter and 100,000 siemens per meter. The specific range of the electrical conductivity of the electrical conductivity is critical to the operation of the electromagnetic interference shield layer 150, as that specific range of electrical conductivity results in electromagnetic fields, either generated by the microelectronic die 110 or generated by components (not shown) external to the microelectronic package 100, scattering within the electromagnetic interference shield layer 150 and attenuating. Thus, the electromagnetic interference shield layer 150 can prevent electromagnetic field interference without the need to be grounded.

In an embodiment of the present description, the electromagnetic interference shield layer 150 may be composite of a combination of electrically conductive materials and non-electrically conductive materials. In one embodiment, the non-electrically conductive material of the electromagnetic interference shield layer 150 may include, but is not limited to, acrylates, bismaleimides, polyesters, polyimides, polyolefins, polystyrene, polyurethanes, epoxies, and the like, as well as combinations thereof. In one embodiment, conductive material of the electromagnetic interference shield layer 150 may include conductive particles or fillers to achieve its specific electrical conductivity range. These electrically conductive fillers may include, but are not limited to, metal particles or powders, such as, silver, copper, aluminum, gold, chromium, alloys thereof, mixtures thereof, and the like. In a further embodiment, in order to achieve a desired electrical conductivity range, the electrically conductive fillers may comprise between about 30 percent and 80 percent by weight of the electromagnetic interference shield layer 150. As will be understood to those skilled in the art, the amount of conductive filler may depend on the conductivity and particle size of the conductive filler. It is further understood that additional filler particles may also be used, including non-electrically conductive particles, such as silica, alumina, boron nitride, zinc oxide, combinations thereof, and the like.

In further embodiments of the present description, when an epoxy material is used as the non-conductive material, the epoxy material may be homo-polymerized or may contain one or more hardeners. Examples of hardeners include amines, phenols, anhydrides, and the like and their mixtures.

In still further embodiments, the electromagnetic interference shield layer 150 may contain additives known in the art, including colorants, catalysts, inhibitors, ion trappers, stress absorbers, surfactants, binding agents, fluxing agents, combinations thereof, and the like.

In yet still a further embodiment of the present description, the electromagnetic interference shield layer 150 may be composite of a combination of electrically conductive materials, as previously discussed, and semi-electrically conductive materials, such as silicon.

Figure 2:
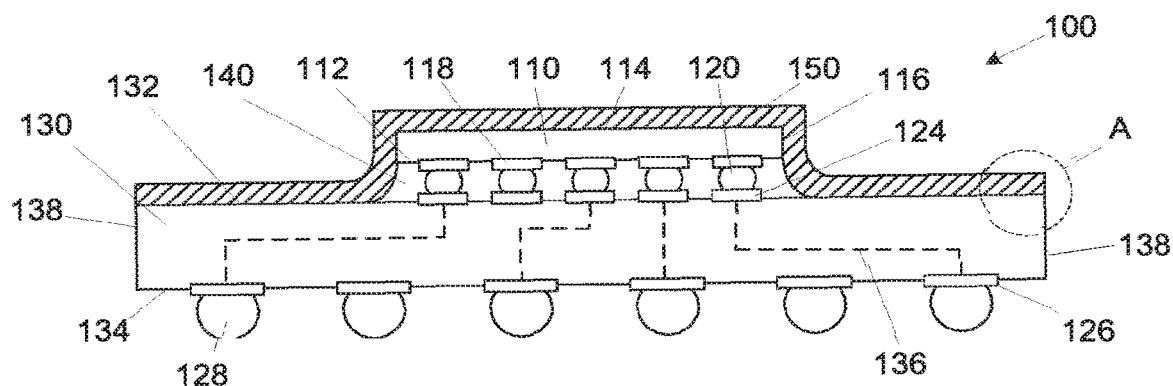
FIG. 2 is a side cross-sectional view of a microelectronic die attached to a microelectronic substrate with an electromagnetic interference shield layer disposed on a back surface of the microelectronic die and on a portion of a first surface of the microelectronic substrate to form a microelectronic package, according to an embodiment of the present description.
Figure 3:
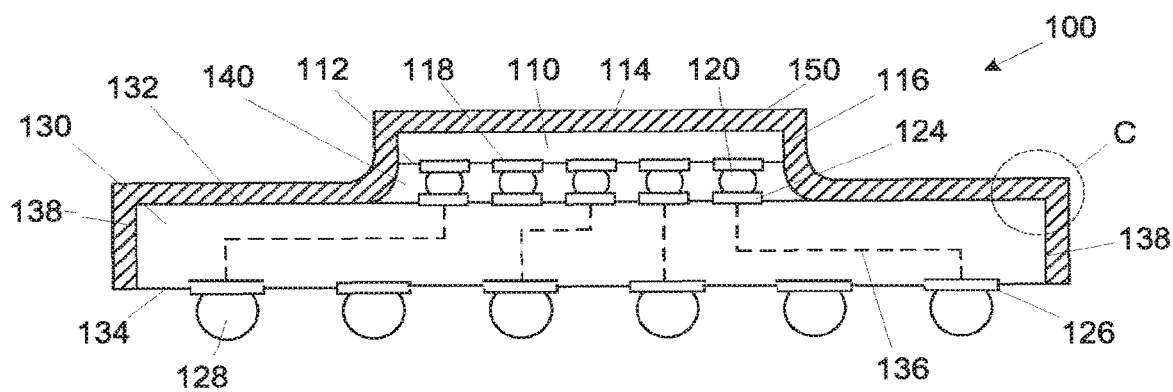
FIG. 3 is a side cross-sectional view of a microelectronic die attached to a microelectronic substrate with an electromagnetic interference shield layer disposed on a back surface of the microelectronic die, on a portion of a first surface of the microelectronic substrate, and on at least one side of the microelectronic substrate to form a microelectronic package, according to an embodiment of the present description.

The positioning of the electromagnetic interference shield layer 150 may be determined by which component(s) need to be shielded from electromagnetic fields. As shown in FIG. 2, the electromagnetic interference shield layer 150 may extend over the back surface 114 of the microelectronic die 110 and over a portion of the first surface 132 of the microelectronic substrate 130. As shown in FIG. 3, the electromagnetic interference shield layer 150 may extend over the back surface 114 of the microelectronic die 110, over the first surface 132 of the microelectronic substrate 130, and over at least one side 138 of the microelectronic substrate 130, wherein the at least one side 138 extends between the first surface 132 and the second surface 134 of the microelectronic substrate 130. In various embodiments, the electromagnetic interference shield layer 150 may contact the microelectronic die 110, the first surface 132 of the microelectronic substrate 130, and/or the at least one side 138 of the microelectronic substrate 130.

Figure 4:
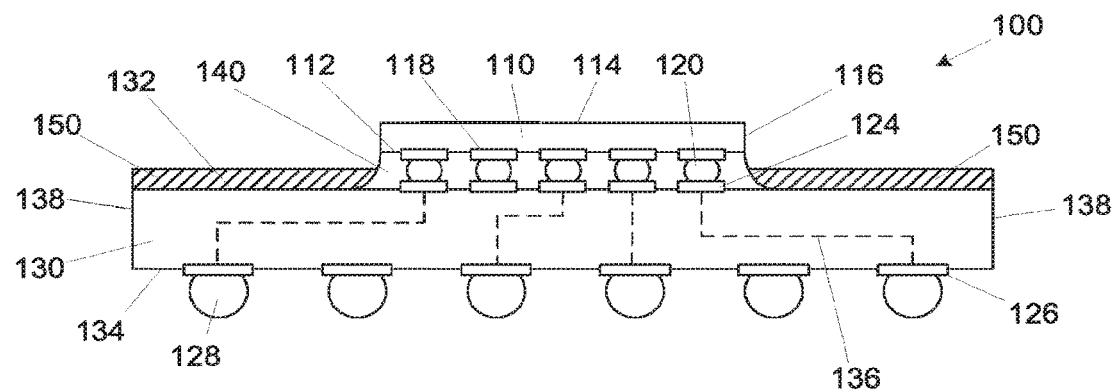
FIG. 4 is a side cross-sectional view of a microelectronic die attached to a microelectronic substrate with an electromagnetic interference shield layer disposed on a portion of a first surface of the microelectronic substrate to form a microelectronic package, according to an embodiment of the present description.
Figure 5:
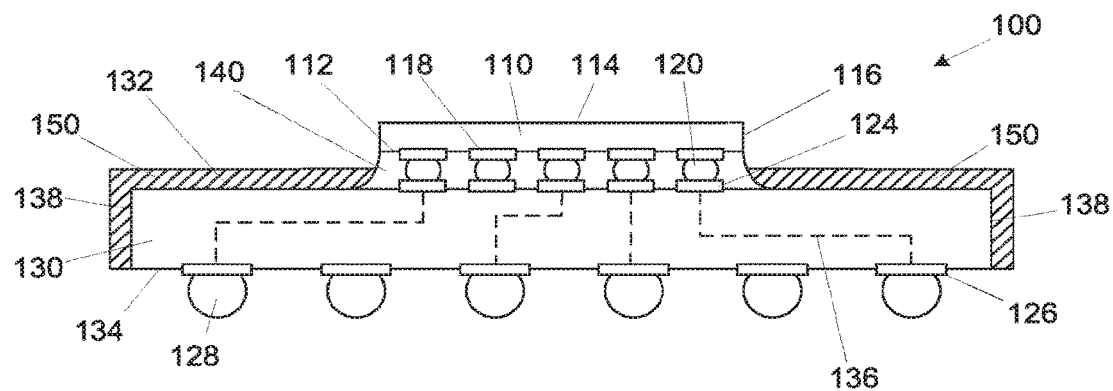
FIG. 5 is a side cross-sectional view of a microelectronic die attached to a microelectronic substrate with an electromagnetic interference shield layer disposed on a portion of a first surface of the microelectronic substrate, and on at least one side of the microelectronic substrate to form a microelectronic package, according to an embodiment of the present description.

It may not be necessary to protect the microelectronic die 110 from electromagnetic interference fields, thus, as shown in FIG. 4, the electromagnetic interference shield 150 may only extend over a portion of the first surface 132 of the microelectronic substrate 130, or, as shown in FIG. 5, the electromagnetic interference shield 150 may extend over a portion of the first surface 132 of the microelectronic substrate 130, and over the at least one side 138 of the microelectronic substrate 130.

Figure 6:
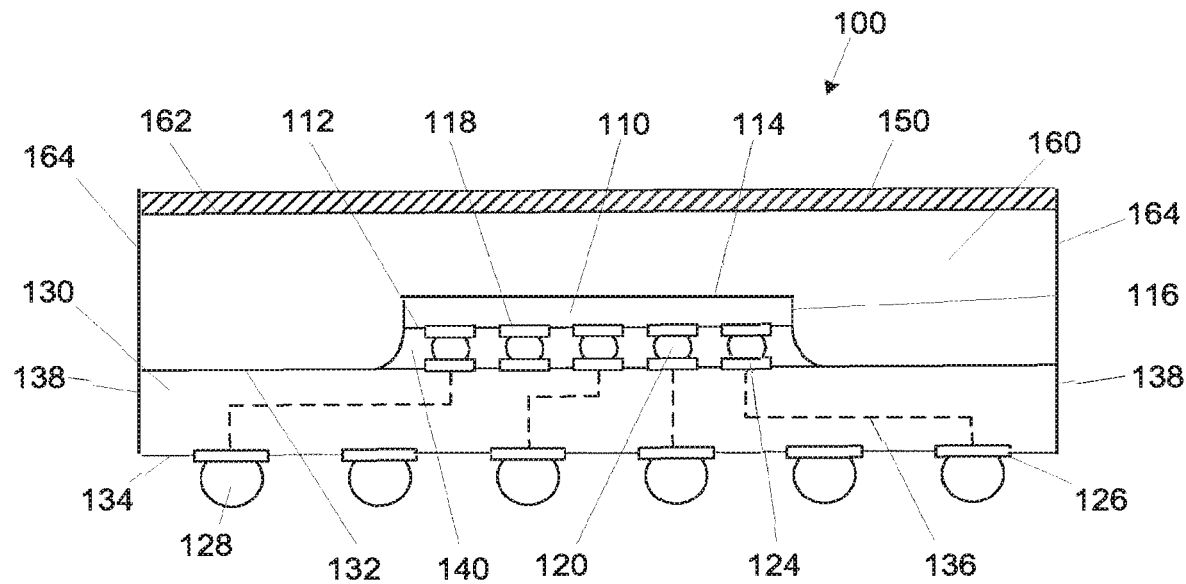
FIG. 6 is a side cross-sectional view of a microelectronic die attached to a microelectronic substrate with an encapsulant material disposed on the microelectronic die and on a portion of a first surface of the microelectronic substrate and with an electromagnetic interference shield layer disposed on an upper surface of the encapsulant material, according to an embodiment of the present description.
Figure 7:
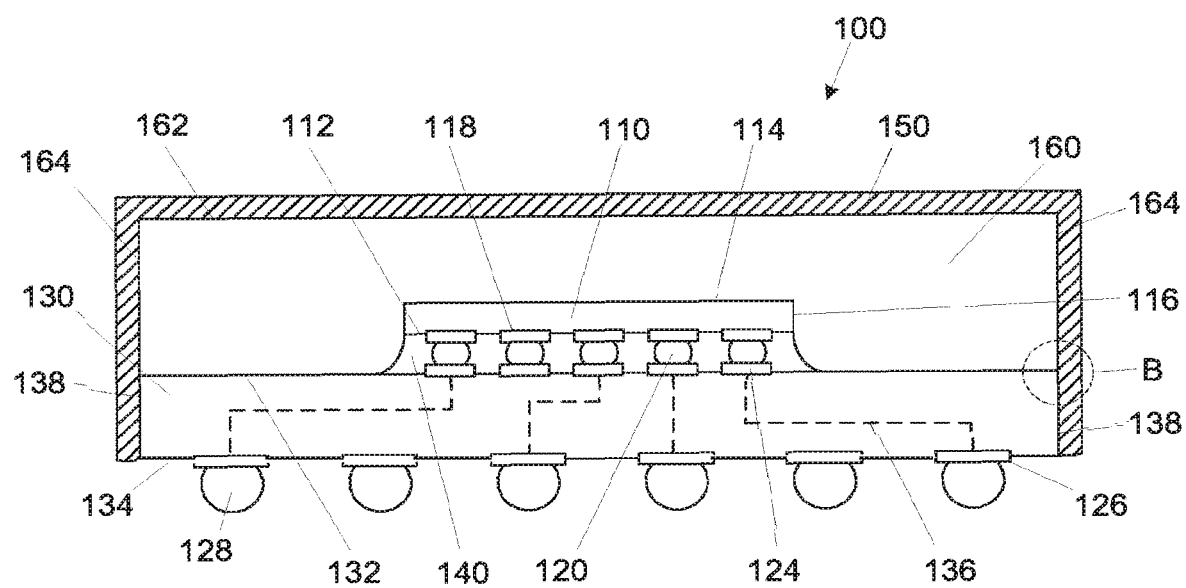
FIG. 7 is a side cross-sectional view of a microelectronic die attached to a microelectronic substrate with an encapsulant material disposed on the microelectronic die and on a portion of a first surface of the microelectronic substrate and with an electromagnetic interference shield layer disposed on an upper surface of the encapsulant material, on at least one side of the encapsulant material, and on at least one side of the microelectronic substrate, according to an embodiment of the present description.

In further embodiments, the microelectronic package 100 may include an encapsulant material. As shown in FIG. 6, an encapsulant material 160 may be disposed over the microelectronic die 110 and the first surface 132 of the microelectronic substrate 130, wherein the encapsulant material 160 may form an upper surface 162, which is opposite the first surface 132 of the microelectronic substrate 130, and at least one side 164 extending between the upper surface 162 of the encapsulant material 160 and the first surface 132 of the microelectronic substrate 130. As further shown in FIG. 6, the electromagnetic interference shield layer 150 may extend over the upper surface 162 of the encapsulant material 160. Additionally, as shown in FIG. 7, the electromagnetic interference shield layer 150 may extend over the upper surface 162 of the encapsulant material 160, over the at least one side 164 of the encapsulant material 160, and over the at least one side 138 of the microelectronic substrate 130.

Figure 8:
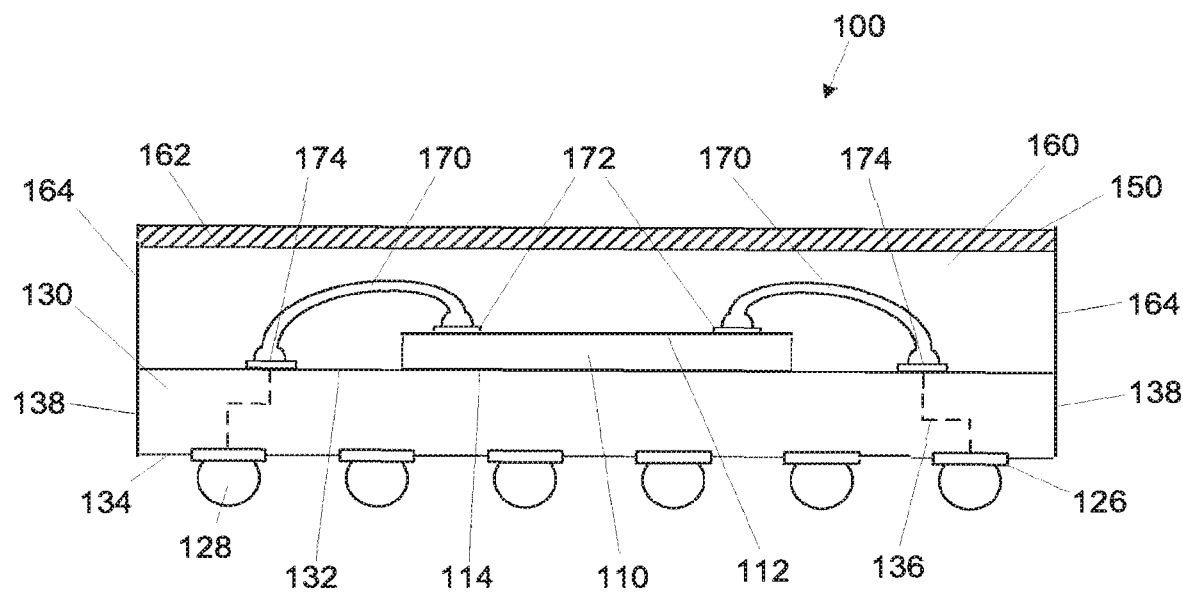
FIG. 8 is a side cross-sectional view of a microelectronic die electrically attached to a microelectronic substrate by bond wires with an encapsulant material disposed on the microelectronic die and on a portion of a first surface of the microelectronic substrate and with an electromagnetic interference shield layer disposed on an upper surface of the encapsulant material, according to an embodiment of the present description.

As shown in FIG. 8, when the encapsulant material 160 is used, the microelectronic die 110 may be electrically connected to the microelectronic substrate 130 through bond wires 170. The back surface 114 of the microelectronic die 110 may be attached to the first surface 132 of the microelectronic substrate 130 and the bond wires 170 may extend between die bond pads 172 on the active surface 112 of the microelectronic die 110 and substrate bond pads 174 on the first surface 132 of the microelectronic substrate 130.

Figure 9:
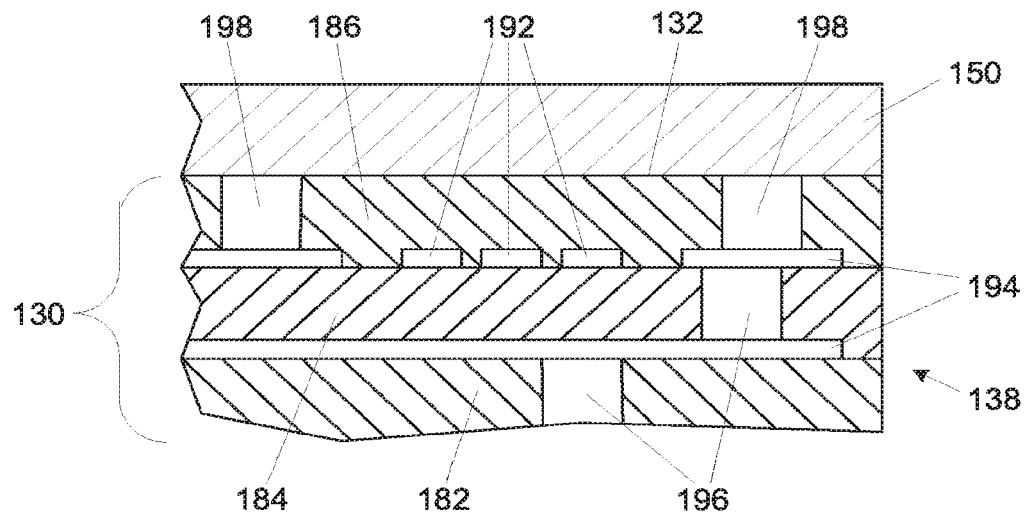
FIGS. 9-11 are side cross-sectional views of various configurations of the electromagnetic interference shield layer acting as a ground reference plane for the microelectronic substrate, according to an embodiment of the present description.
Figure 10:
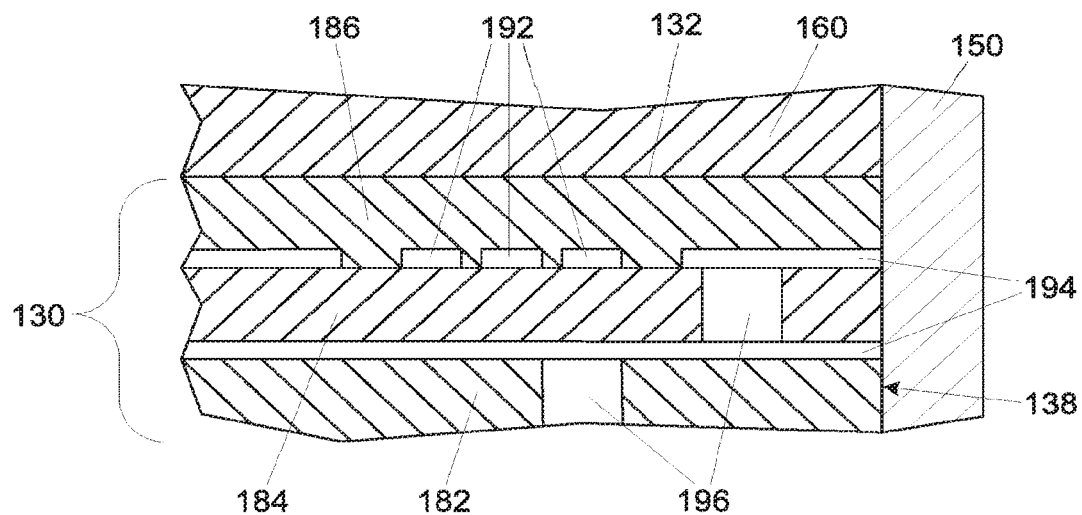
Figure 11:
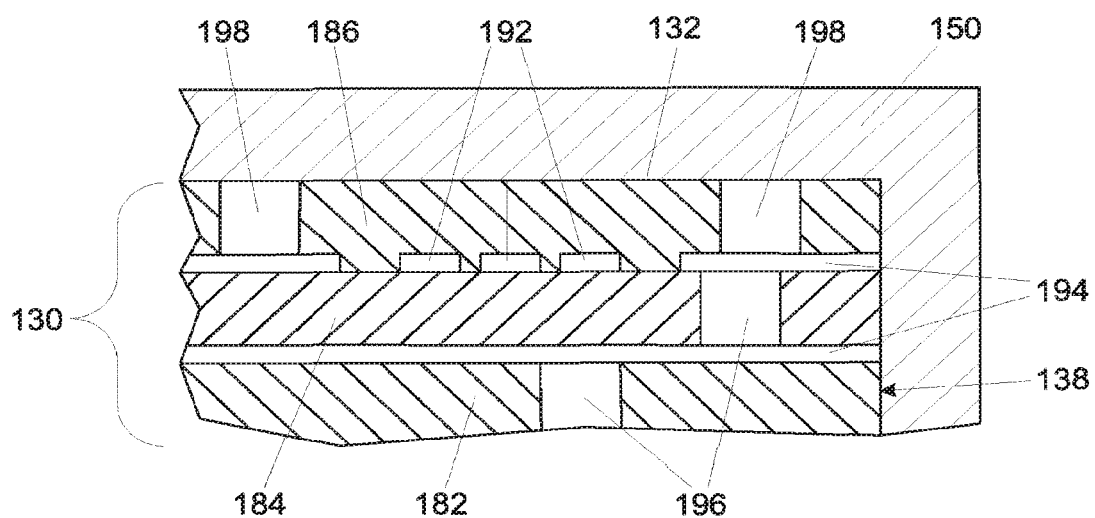

As previously discussed, the electromagnetic interference shield layer 150 need not be grounded. However, the electromagnetic interference shield layer 150 may be grounded and act as a ground "Vss" reference plane. For example, as shown in FIG. 9, which is inset A of FIG. 2, the microelectronic substrate 130 may comprise a plurality of non-electrically conductive layers such as a first dielectric layer 182, a second dielectric layer 184, and an uppermost layer comprising a solder resist layer 186. The conductive routes 136 of FIGS. 1-7 may comprises a plurality of conductive traces including signal traces 192 and grounding traces 194 formed on the first dielectric layer 182 and/or the second dielectric layer 184. The conductive traces may be connected through conductive vias 196 extending through the first dielectric layer 182 and/or the second dielectric layer 184. When the electromagnetic interference shield layer 150 is only disposed on the microelectronic package surface first surface 132, such as with the embodiment of FIG. 2, at least one shield-to-trace conductive via 198 may be formed between the electromagnetic interference shield layer 150 to at least one grounding trace 194. As shown in FIG. 10, which is inset B of FIG. 7, when the electromagnetic interference shield layer 150 is only disposed on the microelectronic package side 138, such as with the embodiment of FIG. 7, at least one of the ground trace 194 may extend to the microelectronic package side 138 and contact the electromagnetic interference shield layer 150. As shown in FIG. 11, which is inset C of FIG. 3, when the electromagnetic interference shield layer 150 is disposed on both the microelectronic package first surface 132 and the microelectronic package side 138, such as with the embodiments of FIGS. 3 and 4, at least one of the ground trace 194 may extend to the microelectronic package side 138 and contact the electromagnetic interference shield layer 150, and at least one shield-to-trace conductive via 198 may be formed between the electromagnetic interference shield layer 150 to at least one grounding trace 194.

Figure 12:
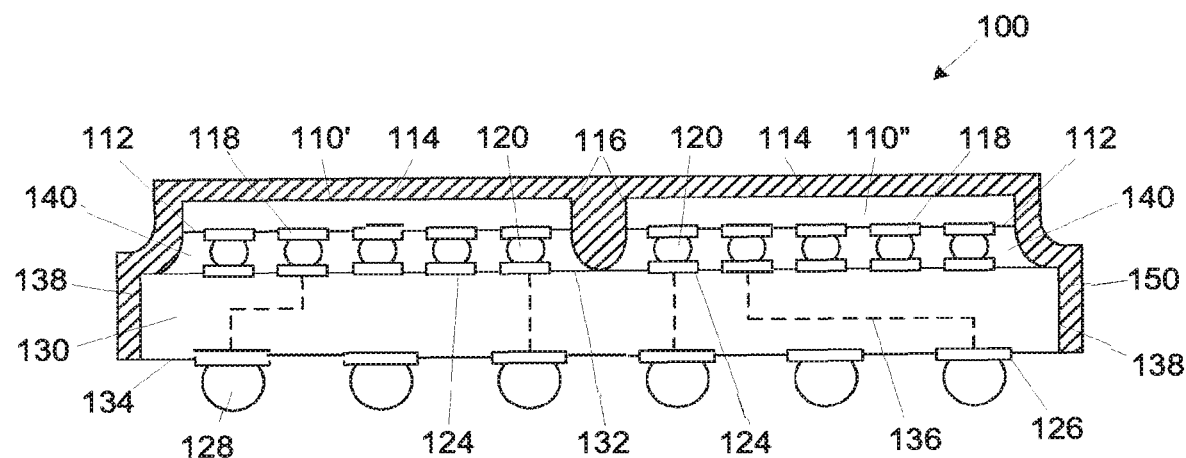
FIG. 12 is a side cross-sectional view of multiple microelectronic dice attached to a microelectronic substrate, according to an embodiment of the present description.
Figure 13:
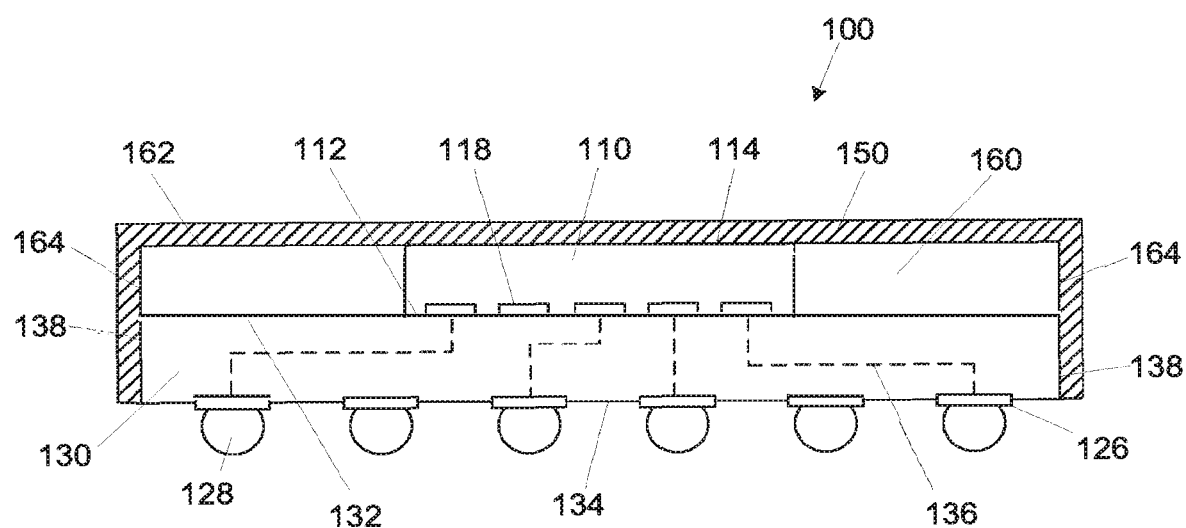
FIG. 13 is a side cross-sectional view of an embedded microelectronic die wherein the microelectronic substrate is a build-up layer, according to an embodiment of the present description.

As will be understood, embodiments of the present description are not limited to single microelectronic device applications. As shown in FIG. 12 any number of microelectronic dice (illustrated as first microelectronic die 110' and second microelectronic die 110") may be electrically attached to the microelectronic substrate 130. Furthermore, the embodiments of the present description may include embedded die applications, as shown in FIG. 13, wherein the microelectronic die 110 is embedded in the encapsulant material 160 and the microelectronic substrate 130 is formed on the embedded microelectronic die 110 as build-up layer.

It is, of course, understood that the electromagnetic interference shield layer 150 may be thermally conductive and, thus, may assist in the removal of heat generated within the microelectronic package 100.

The electromagnetic interference shield layer 150 shown in FIGS. 1-13 may be applied to the microelectronic die 110 and/or the microelectronic substrate 130 by any method known in the art, including but not limited to sputtering, spray coating, printing, curtain coating, molding, lamination, and the like. The method of application may be a function of a desired thickness of the electromagnetic interference shield layer 150. For example, sputtering may be used to achieve a thickness of about 5 microns, spray coating may be used to achieve a thickness of about 5 to 50 microns, and printing may be used to achieve a thickness of greater than about 50 microns.

Figure 14:
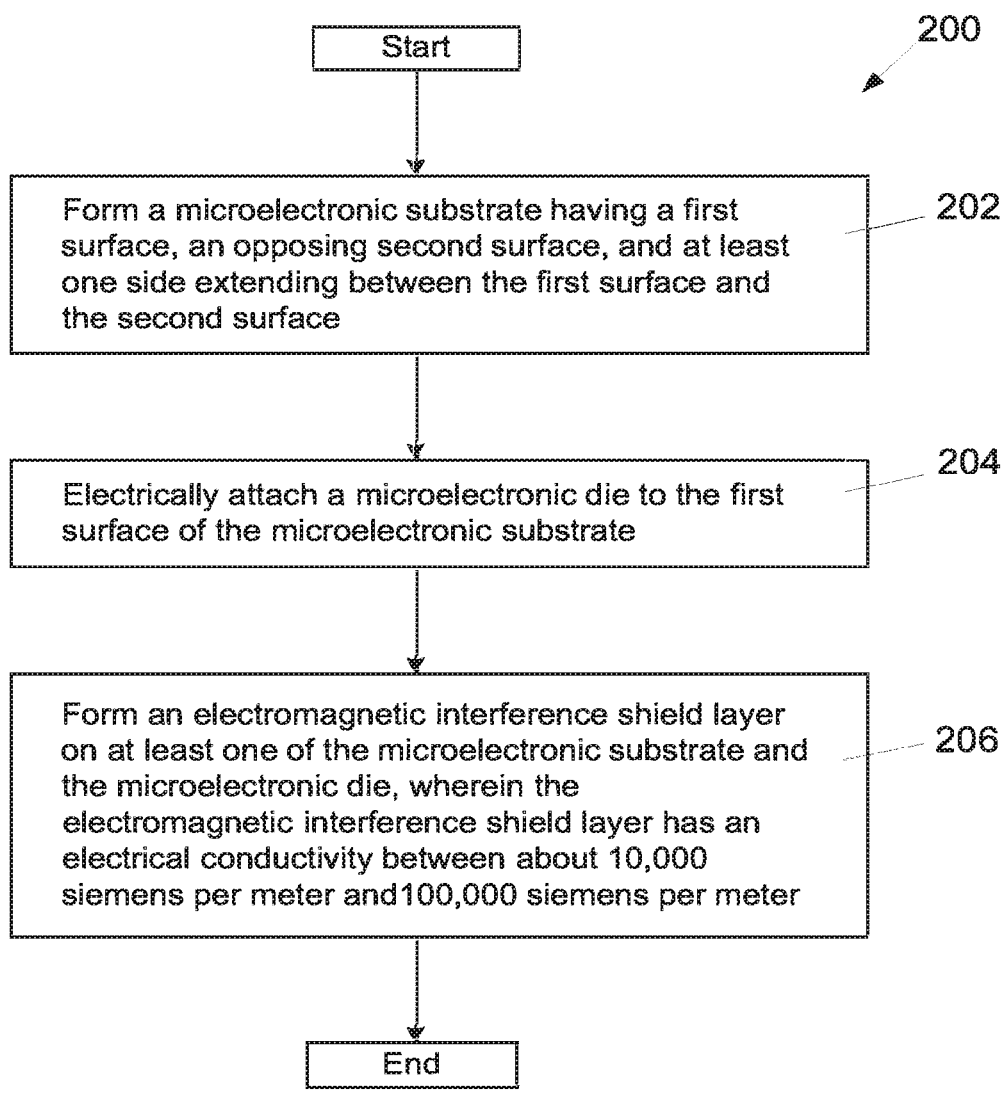
FIG. 14 is a flow diagram of the method of fabricating a microelectronic package, according to one embodiment of the present description.

FIG. 14 is a flow chart of a process 200 of fabricating a microelectronic package, according to an embodiment of the present description. As set forth in block 202, a microelectronic substrate having a first surface, an opposing second surface and at least one side extending between the first surface and the second surface may be formed. A microelectronic die may be electrically attached to the first surface of the microelectronic substrate, as set forth in block 204. As set forth in block 206, an electromagnetic interference shield layer may be formed on at least one of the microelectronic substrate and the microelectronic die, wherein the electromagnetic interference shield layer has an electrical conductivity between about 10,000 siemens per meter to 100,000 siemens per meter.

Figure 15:
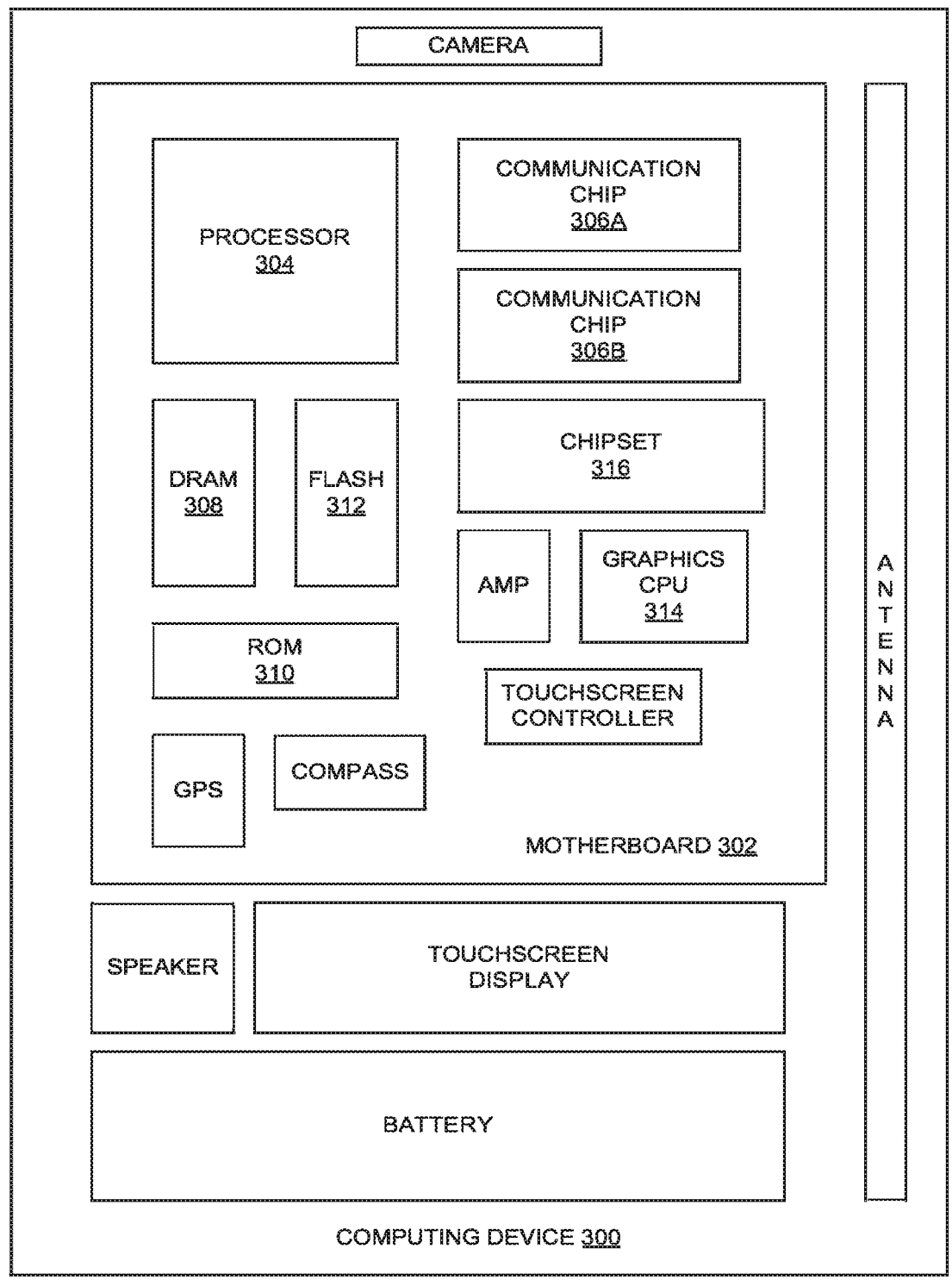
FIG. 15 illustrates a computing device in accordance with one implementation of the present description.

FIG. 15 illustrates a computing device 300 in accordance with one implementation of the present description. The computing device 300 may house a board 302. The board 302 may include a number of microelectronic components attached thereto, including but not limited to a processor 304, at least one communication chip 306A, 306B, volatile memory 308, (e.g., DRAM), non-volatile memory 310 (e.g., ROM), flash memory 312, a graphics processor or CPU 314, a digital signal processor (not shown), a crypto processor (not shown), a chipset 316, an antenna, a display (touchscreen display), a touchscreen controller, a battery, an audio codec (not shown), a video codec (not shown), a power amplifier (AMP), a global positioning system (GPS) device, a compass, an accelerometer (not shown), a gyroscope (not shown), a speaker (not shown), a camera, and a mass storage device (not shown) (such as hard disk drive, compact disk (CD), digital versatile disk (DVD), and so forth). Any of the microelectronic components may be physically and electrically coupled to the board 302. In some implementations, at least one of the microelectronic components may be a part of the processor 304.

The communication chip enables wireless communications for the transfer of data to and from the computing device. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device may include a plurality of communication chips. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others.

The term "processor" may refer to any device or portion of a device that processes electronic data from registers and/or memory to transform that electronic data into other electronic data that may be stored in registers and/or memory.

Any of the microelectronic components within the computing device 300 may include a microelectronic package including a microelectronic substrate, a microelectronic die electrically attached to the microelectronic substrate, and an electromagnetic interference shield layer on at least one of the microelectronic substrate and the microelectronic die, as described above.

In various implementations, the computing device may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device may be any other electronic device that processes data.

It is understood that the subject matter of the present description is not necessarily limited to specific applications illustrated in FIGS. 1-13. The subject matter may be applied to other microelectronic device and assembly applications, as will be understood to those skilled in the art.

The following examples pertain to further embodiments, wherein Example 1 is a microelectronic package comprising a microelectronic substrate having a first surface, an opposing second surface and at least one side extending between the first surface and the second surface; a microelectronic die electrically attached to the microelectronic substrate; and an electromagnetic interference shield layer on at least one of the microelectronic substrate and the microelectronic die, wherein the electromagnetic interference shield layer has an electrical conductivity between about 10,000 siemens per meter and 100,000 siemens per meter.

In Example 2, the subject matter of Example 1 can optionally include the electromagnetic interference shield not being grounded.

In Example 3, the subject matter of Example 1 can optionally include the electromagnetic interference shield layer being grounded and wherein the microelectronic substrate is electrically connected to the electromagnetic interference shield layer.

In Example 4, the subject matter of any of Examples 1 to 3 can optionally include the electromagnetic interference shield layer is on a back surface of the microelectronic die.

In Example 5, the subject matter of Example 4 can optionally include the electromagnetic interference shield layer on a portion of a first surface of the microelectronic substrate.

In Example 6, the subject matter of Example 5 can optionally include the electromagnetic interference shield layer on at least one side of the microelectronic substrate.

In Example 7, the subject matter of any of Examples 1 to 3 can optionally include the electromagnetic interference shield layer on a portion of a first surface of the microelectronic substrate without being on the back surface of the microelectronic die.

In Example 8, the subject matter of Example 7 can optionally include the electromagnetic interference shield layer on at least one side of the microelectronic substrate.

In Example 9, the subject matter of any of Examples 1 to 3 can optionally include an encapsulant material on a back surface of the microelectronic die and on a portion of a first surface of the microelectronic substrate, wherein the electromagnetic interference shield layer is on an upper surface of the encapsulant material.

In Example 10, the subject matter of Example 9 can optionally include the microelectronic die being electrically connected to the microelectronic substrate with at least one bond wire.

In Example 11, the subject matter of any of Examples 1 to 3 can optionally include an encapsulant material on a back surface of the microelectronic die and on a portion of a first surface of the microelectronic substrate, wherein the electromagnetic interference shield layer is on an upper surface of the encapsulant material, at least one side of the encapsulant material, and at least one side of the microelectronic substrate.

In Example 12, the subject matter of Example 11 can optionally include the microelectronic die being electrically connected to the microelectronic substrate with at least one bond wire.

The following examples pertain to further embodiments, wherein Example 13 is a method of fabricating a microelectronic package, comprising forming a microelectronic substrate having a first surface, an opposing second surface and at least one side extending between the first surface and the second surface; electrically attaching a microelectronic die to the microelectronic substrate; and forming an electromagnetic interference shield layer on at least one of the microelectronic substrate and the microelectronic die, wherein the electromagnetic interference shield layer has an electrical conductivity between about 10,000 siemens per meter and 100,000 siemens per meter.

In Example 14, the subject matter of Example 13 can optionally include forming the electromagnetic interference shield comprising forming a non-grounded electromagnetic interference shield layer.

Example 15, the subject matter of Example 13 can optionally include forming the electromagnetic interference shield layer comprising forming a grounded electromagnetic interference shield layer and further comprising electrically connecting the microelectronic substrate to the electromagnetic interference shield layer.

In Example 16, the subject matter of any of Examples 13 to 15 can optionally include forming the electromagnetic interference shield layer on a back surface of the microelectronic die.

In Example 17, the subject matter of Example 16 can optionally include forming the electromagnetic interference shield layer on a portion of a first surface of the microelectronic substrate.

In Example 18, the subject matter of Example 17 can optionally include forming the electromagnetic interference shield layer on a portion of a first surface of the microelectronic substrate.

In Example 19, the subject matter of any of Examples 13 to 15 can optionally include forming the electromagnetic interference shield layer on a portion of a first surface of the microelectronic substrate without being on the back surface of the microelectronic die.

In Example 20, the subject matter of Example 19 can optionally include forming the electromagnetic interference shield layer on at least one side of the microelectronic substrate.

In Example 21, the subject matter of any of Examples 13 to 15 can optionally include forming an encapsulant material on a back surface of the microelectronic die and on a portion of a first surface of the microelectronic substrate, wherein the electromagnetic interference shield layer is formed on an upper surface of the encapsulant material.

In Example 22, the subject matter of Example 21 can optionally include electrically connecting the microelectronic die to the microelectronic substrate with at least one bond wire.

In Example 23, the subject matter of any of Examples 13 to 15 can optionally include forming an encapsulant material on a back surface of the microelectronic die and on a portion of a first surface of the microelectronic substrate, wherein the electromagnetic interference shield layer is formed on an upper surface of the encapsulant material, on at least one side of the encapsulant material, and on at least one side of the microelectronic substrate.

In Example 24, the subject matter of Example 23 can optionally include electrically connecting the microelectronic die to the microelectronic substrate with at least one bond wire.

The following examples pertain to further embodiments, wherein Example 25 is a computing device, comprising a board; and a microelectronic package attached to the board, wherein the microelectronic package includes a microelectronic substrate having a first surface, an opposing second surface and at least one side extending between the first surface and the second surface; a microelectronic die electrically attached to the microelectronic substrate; and an electromagnetic interference shield layer on at least one of the microelectronic substrate and the microelectronic die, wherein the electromagnetic interference shield layer has an electrical conductivity between about 10,000 siemens per meter and 100,000 siemens per meter.

In Example 26, the subject matter of Example 25 can optionally include the electromagnetic interference shield not being grounded.

In Example 27, the subject matter of Example 25 can optionally include the electromagnetic interference shield layer being grounded and wherein the microelectronic substrate is electrically connected to the electromagnetic interference shield layer.

In Example 28, the subject matter of any of Examples 25 to 27 can optionally include the electromagnetic interference shield layer is on a back surface of the microelectronic die.

In Example 29, the subject matter of Example 28 can optionally include the electromagnetic interference shield layer on a portion of a first surface of the microelectronic substrate.

In Example 30, the subject matter of Example 29 can optionally include the electromagnetic interference shield layer on a portion of a first surface of the microelectronic substrate.

In Example 31, the subject matter of any of Examples 25 to 27 can optionally include the electromagnetic interference shield layer on a portion of a first surface of the microelectronic substrate without being on the back surface of the microelectronic die.

In Example 32, the subject matter of Example 31 can optionally include the electromagnetic interference shield layer on at least one side of the microelectronic substrate.

In Example 33, the subject matter of any of Examples 25 to 27 can optionally include an encapsulant material on a back surface of the microelectronic die and on a portion of a first surface of the microelectronic substrate, wherein the electromagnetic interference shield layer is on an upper surface of the encapsulant material.

In Example 34, the subject matter of Example 33 can optionally include the microelectronic die being electrically connected to the microelectronic substrate with at least one bond wire.

In Example 35, the subject matter of any of Examples 25 to 27 can optionally include an encapsulant material on a back surface of the microelectronic die and on a portion of a first surface of the microelectronic substrate, wherein the electromagnetic interference shield layer is on an upper surface of the encapsulant material, at least one side of the encapsulant material, and at least one side of the microelectronic substrate.

In Example 36, the subject matter of Example 35 can optionally include the microelectronic die being electrically connected to the microelectronic substrate with at least one bond wire.

Having thus described in detail embodiments of the present description, it is understood that the present description defined by the appended claims is not to be limited by particular details set forth in the above description, as many apparent variations thereof are possible without departing from the spirit or scope thereof.

What is claimed is:

1. A microelectronic package, comprising:
   a microelectronic substrate having a first surface, an opposing second surface and at least one side extending between the first surface and the second surface;
   a microelectronic die electrically attached to the microelectronic substrate; and
   an electromagnetic interference shield layer on at least one of the microelectronic substrate and the microelectronic die, wherein the electromagnetic interference shield layer has an electrical conductivity between about 10,000 siemens per meter to 100,000 siemens per meter.

2. The microelectronic package of claim 1, wherein the electromagnetic interference shield layer is not grounded.

3. The microelectronic package of claim 1, wherein the electromagnetic interference shield layer is grounded and wherein the microelectronic substrate is electrically connected to the electromagnetic interference shield layer.

4. The microelectronic package of claim 1, wherein the electromagnetic interference shield layer is on at least one of a back surface of the microelectronic die, a portion of a first surface of the microelectronic substrate, and at least one side of the microelectronic substrate.

5. The microelectronic package of claim 1, wherein the electromagnetic interference shield layer is on a portion of a first surface of the microelectronic substrate without being on a back surface of the microelectronic die.

6. The microelectronic package of claim 5, further comprising the electromagnetic interference shield layer on at least one side of the microelectronic substrate.

7. The microelectronic package of claim 1, further including an encapsulant material on a back surface of the microelectronic die and on a portion of a first surface of the microelectronic substrate, wherein the electromagnetic interference shield layer is on an upper surface of the encapsulant material.

8. The microelectronic package of claim 7, further including the electromagnetic interference shield layer on at least one side of the encapsulant material and at least one side of the microelectronic substrate.

9. A method of fabricating a microelectronic package, comprising:
   forming a microelectronic substrate having a first surface, an opposing second surface and at least one side extending between the first surface and the second surface;
   electrically attaching a microelectronic die to the microelectronic substrate; and
   forming an electromagnetic interference shield layer on at least one of the microelectronic substrate and the microelectronic die, wherein the electromagnetic interference shield layer has an electrical conductivity between about 10,000 siemens per meter to 100,000 siemens per meter.

10. The method of claim 9, wherein forming the electromagnetic interference shield layer comprises forming a non-grounded electromagnetic interference shield layer.

11. The method of claim 9, wherein forming the electromagnetic interference shield layer comprises forming a grounded electromagnetic interference shield layer and further comprising electrically connecting the microelectronic substrate to the electromagnetic interference shield layer.

12. The method of claim 9, wherein forming the electromagnetic interference shield layer comprises forming the electromagnetic interference shield layer on at last one of a back surface of the microelectronic die, a portion of a first surface of the microelectronic substrate, and at least one side of the microelectronic substrate.

13. The method of claim 9, wherein forming the electromagnetic interference shield layer comprises forming the electromagnetic interference shield layer on a portion of a first surface of the microelectronic substrate without being on the back surface of the microelectronic die.

14. The method of claim 13, wherein forming the electromagnetic interference shield layer comprises forming the electromagnetic interference shield layer on at least one side of the microelectronic substrate.

15. The method of claim 9, further including forming an encapsulant material on a back surface of the microelectronic die and on a portion of a first surface of the microelectronic substrate, and wherein the electromagnetic interference shield layer is formed on an upper surface of the encapsulant material.

16. The method of claim 15, further including forming the electromagnetic interference shield layer on at least one side of the encapsulant material and on at least one side of the microelectronic substrate.

17. A computing device, comprising:
a board; and
a microelectronic package attached to the board, wherein the microelectronic package includes:
a microelectronic substrate having a first surface, an opposing second surface and at least one side extending between the first surface and the second surface;
a microelectronic die electrically attached to the microelectronic substrate; and
an electromagnetic interference shield layer on at least one of the microelectronic substrate and the microelectronic die, wherein the electromagnetic interference shield layer has an electrical conductivity between about 10,000 siemens per meter to 100,000 siemens per meter.

18. The computing device of claim 17, wherein the electromagnetic interference shield layer is not grounded.

19. The computing device of claim 17, wherein the electromagnetic interference shield layer is grounded and wherein the microelectronic substrate is electrically connected to the electromagnetic interference shield layer.

20. The computing device of claim 17, wherein the electromagnetic interference shield layer is on at least one of a back surface of the microelectronic die, a portion of a first surface of the microelectronic substrate, and at least one side of the microelectronic substrate.

21. The computing device of claim 17, wherein the electromagnetic interference shield layer is on a portion of a first surface of the microelectronic substrate without being on the back surface of the microelectronic die.

22. The computing device of claim 21, further comprising the electromagnetic interference shield layer on at least one side of the microelectronic substrate.

23. The computing device of claim 17, further including an encapsulant material on a back surface of the microelectronic die and on a portion of a first surface of the microelectronic substrate, wherein the electromagnetic interference shield layer is on an upper surface of the encapsulant material.

24. The computing device of claim 23, further including the electromagnetic interference shield layer on at least one side of the encapsulant material and at least one side of the microelectronic substrate.

* * * * *